(12) United States Patent
Pichler

(10) Patent No.: US 7,891,314 B2
(45) Date of Patent: Feb. 22, 2011

(54) FLUID DISCHARGING DEVICE

(75) Inventor: Stefan Pichler, Villach (AT)

(73) Assignee: Lam Research AG, Villach (AT)

( * ) Notice: Subject to any disclaimer, the term of this patent is extended or adjusted under 35 U.S.C. 154(b) by 1048 days.

(21) Appl. No.: 11/659,668

(22) PCT Filed: Jul. 5, 2005

(86) PCT No.: PCT/EP2005/053197

§ 371 (c)(1),
(2), (4) Date: Feb. 7, 2007

(87) PCT Pub. No.: WO2006/008236

PCT Pub. Date: Jan. 26, 2006

(65) Prior Publication Data

US 2008/0048056 A1    Feb. 28, 2008

(30) Foreign Application Priority Data

Jul. 20, 2004    (AT) ............................ A 1231/2004

(51) Int. Cl.
*B05C 5/02*    (2006.01)
(52) U.S. Cl. ................. 118/300; 118/313; 118/315; 239/398; 239/416.1; 239/418; 239/423

(58) Field of Classification Search ............... 118/300, 118/313, 315; 239/398, 416.1, 416.2, 417.3, 239/418, 423, 290, 291; 427/421.1, 426
See application file for complete search history.

(56) References Cited

U.S. PATENT DOCUMENTS

| 3,626,722 | A | * | 12/1971 | Corsentino | ................. 65/447 |
| 4,508,054 | A | * | 4/1985 | Baumberger et al. | ........ 118/718 |
| 5,165,605 | A | | 11/1992 | Morita et al. | |
| 5,800,867 | A | * | 9/1998 | Matsunaga et al. | .......... 427/476 |
| 6,290,863 | B1 | | 9/2001 | Morgan et al. | |
| 6,447,632 | B1 | | 9/2002 | Shinozuka et al. | |
| 2003/0057848 | A1 | | 3/2003 | Yuasa et al. | |

FOREIGN PATENT DOCUMENTS

EP    1 168 419    1/2002
WO    WO 2004008905    1/2004

* cited by examiner

*Primary Examiner*—Laura Edwards
(74) *Attorney, Agent, or Firm*—Young & Thompson

(57) ABSTRACT

Disclosed is a fluid discharging device (1) for separately discharging at least two fluids comprising and inner nozzle (3) for discharging a first fluid and a coaxially arranged outer nozzle (12) for discharging a second fluid.

7 Claims, 2 Drawing Sheets

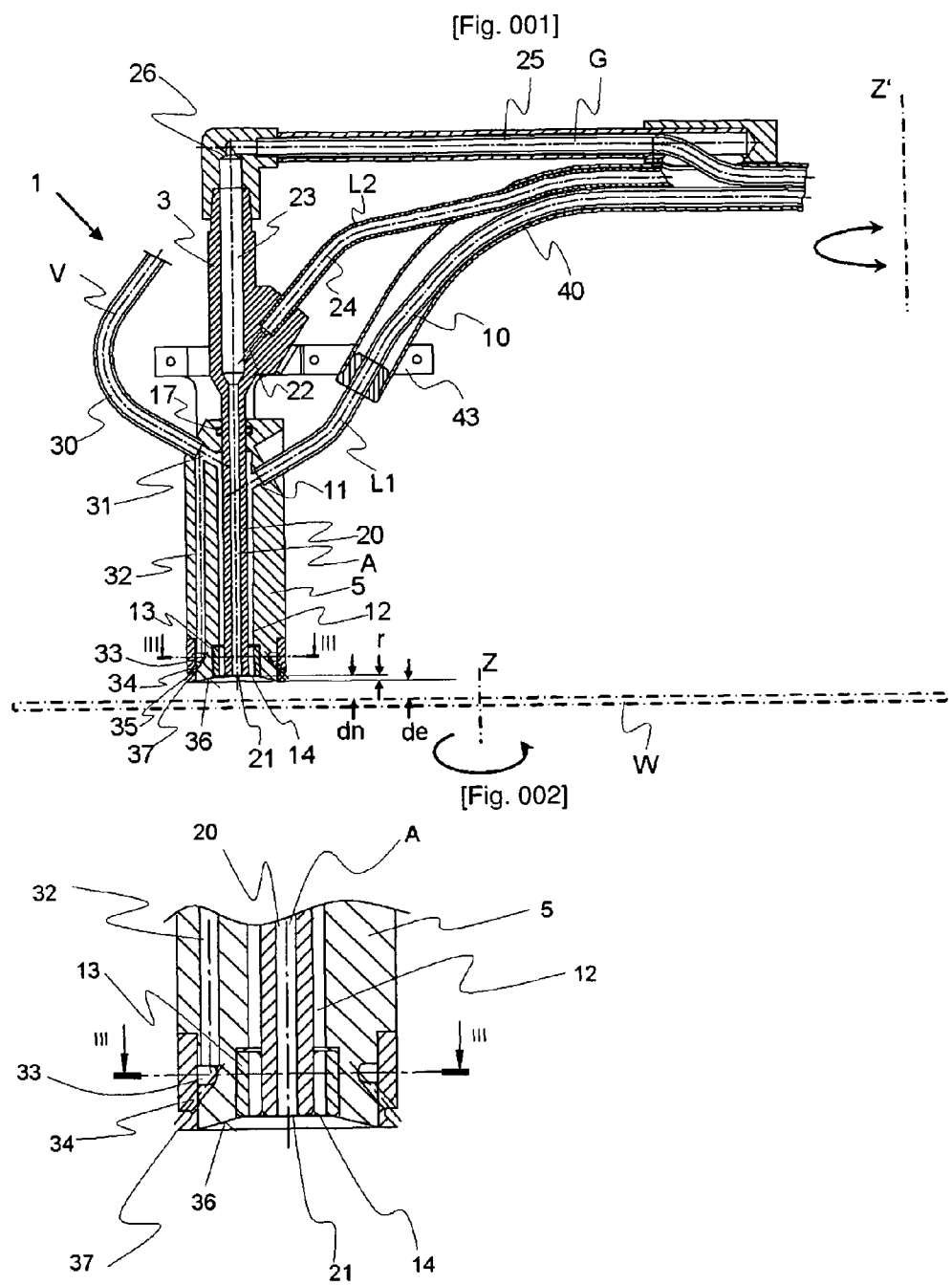

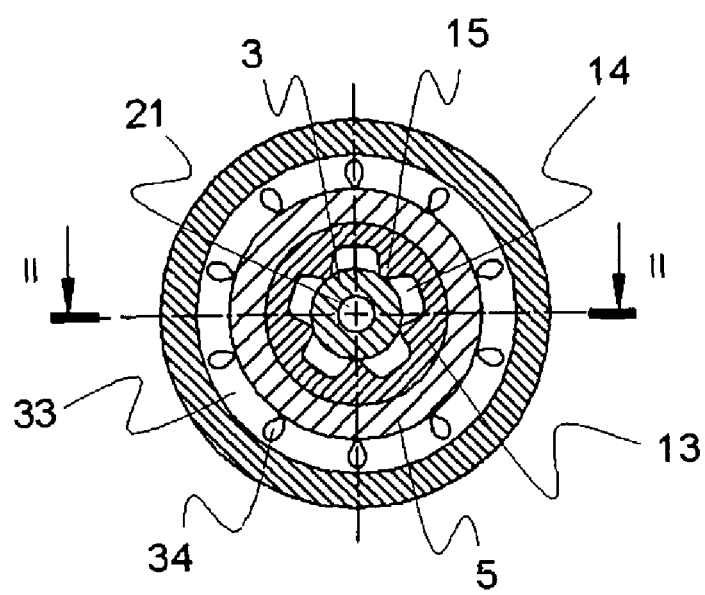
[Fig. 003]

FLUID DISCHARGING DEVICE

TECHNICAL FIELD

The invention relates to a fluid discharging device for separately discharging at least two fluids. Such a fluid can be liquid or gas or a mixture thereof. Mixtures of liquid or gas comprise fluids having gas as the continuous phase and liquid as the disperse phase (e.g. aerosols) and fluids having liquid as the continuous phase and gas as the disperse phase (e.g. carbonated water).

The invention further relates to a device and a method for wet treating a flat disc-like substrate, such as semiconductor wafers, flat panel displays or compact discs utilizing such a fluid discharging device. If in the following the term wafer is used, such disk-like substrates are meant.

BACKGROUND ART

Such fluid discharging devices are often used in semiconductor industry e.g. for discharging different liquids (e.g. etchants, cleaning liquids) and gases (e.g. corrosive, non-corrosive, inert) onto a wafer.

U.S. Pat. No. 4,903,717 discloses a liquid discharging device, with which three different liquids (two acids and deionised water) may be separately supplied onto a disc-shaped article e.g. a semiconductor wafer. This system has the shortcoming that when a first liquid is discharged onto a substrate to be treated the nozzle for discharging the second liquid however not used may drip a drop of the second liquid onto said substrate. This may lead to a not satisfying result or even to the destruction of said substrate.

U.S. Pat. No. 6,383,331 discloses a liquid discharging device where different fluids are supplied with different nozzles fixed on different media arms. Such a system brings advantage to avoid unwanted droplets; however the time between the discharging of different liquids depends on the movement of the medium arms.

Object of the invention is to provide a system or device for discharging at least two fluids which shall overcome the above-mentioned short comings.

DISCLOSURE OF INVENTION

The invention meets the objects by providing a fluid discharging device for separately discharging at least two fluids comprising an inner nozzle for discharging a first fluid and a substantially coaxially arranged outer nozzle for discharging a second fluid.

Such an arrangement has the advantage that the centre of ejection of the different fluids is substantially the same and therefore the centre of impact to a surface (e.g. wafer surface) results in being the same.

The outer wall of the inner nozzle may serve as the inner wall of the outer nozzle.

If the inner nozzle is used for discharging an aerosol the outer nozzle can be used for simultaneously discharging liquid, which serves as a protection curtain. The aerosol (e.g. comprising of nitrogen and a cleaning agent) may thus treat a wafer surface and the ambience is protected from aerosol, which might be reflected from the surface. Aerosol droplets are captured by the liquid discharged by the outer nozzle.

With such a fluid discharging device liquids discharged from an outer as well as from an inner nozzle may be effectively mixed in situ on a substrates surface. This is useful especially when a mixture of such liquids can not be stored, which is the case e.g. for nitric acid and hydrochloric acid (resulting in aqua regia).

In any case two coaxially arranged nozzles need less space than two nozzles of the same shape arranged in a parallel way.

In one embodiment of the fluid discharging device said inner nozzle is connected to at least one liquid source and to at least one gas source. This is useful either for dispensing liquid with gas dispersed therein or an aerosol (gas with liquid dispersed therein). Such an aerosol may be premixed in a chamber whereto liquid is injected into the gas stream.

In another embodiment of a fluid discharging device the outer nozzle is at the nozzle's opening (or orifice) split by a connection of the outer nozzle's inner wall with the outer nozzle's outer wall, in order to discharge a fluid flow with a cross sectional shape of an open ring. This splitting is specifically of an advantage if the fluid is liquid. If liquid is dispensed through the outer nozzle (ring nozzle) such liquid stream has a tubular form. The inner atmosphere of the tube would not be connection to the ambient atmosphere. Thus pressure differences may occur, which lead to the formation of bubbles, which further may lead to splashes when the liquid stream contacts a surface (e.g. a wafer surface). The cut of the tubular liquid stream solves that problem. Another advantage of said connection of the outer nozzle's inner wall with the outer nozzle's outer wall is to stabilize said outer and inner walls of the outer nozzle against each other.

Advantageously the outer nozzle is at the nozzle's opening divided into at least two separate parts of the nozzle, in order to discharge said second fluid in at least two separate fluid streams. In this case the openings of the separate parts of the nozzle may have—in a cross sectional view perpendicular to the flow direction—the shape of ring sections. However, the separate parts of the nozzle may have—in a cross sectional view perpendicular to the flow direction—the shape of circles annularly arranged.

In one embodiment of the fluid discharging device the outer nozzle is operatively connected to a liquid source.

In yet another embodiment of the fluid discharging device the outer nozzle is operatively connected to a vacuum source. This is advantageous if the inner nozzle is for supplying an aerosol because an uncontrolled distribution of repelled liquid droplets can be minimized because such repelled droplets are sucked through the outer nozzle during the discharge of the aerosol.

If the outer nozzle is connected to a liquid source as well as to a vacuum source, the vacuum source may be activated immediately after switching off the liquid stream and the liquid hence is sucked back from the nozzles opening. This helps avoiding dripping.

A fluid discharging device according to another embodiment is equipped with a suction device operatively connected to a vacuum source, said suction device comprises suction orifice(s) annularly arranged surrounding said outer and inner nozzle. If liquid is discharged through at least one of the outer or inner nozzle either by liquid stream or in an aerosol, droplets may adhere close to the nozzles opening and migrate radially towards the nozzles edge. With such suction orifice(s) these droplets can be removed.

To further enhance the removal of these droplets an advantageous fluid discharging device has a sharp edge having an angle of below 90° between said outer nozzle and said suction orifice(s).

Another aspect of the invention is a device for wet treatment of disc-shaped articles (e.g. semiconductor wafers) comprising a fluid discharging device of the current invention. Such a device for wet treatment may further comprise a support for rotating a disc-shaped article about an axis substantially perpendicular to said disc-shaped article's main surface.

Advantageously in the device for wet treatment the fluid discharging device is located on a media arm, with a suspension device for said media arm, so that the media arm can perform movement across a disc-shaped article's main surface when treated. E.g. the media arm can perform pivoting movement around an axis substantially perpendicular to said disc-shaped article's main surface.

BRIEF DESCRIPTION OF THE DRAWINGS

FIG. 1 shows a schematic cross sectional side view of a preferred embodiment of the invention.

FIG. 2 shows an enlarged portion of FIG. 1 near the nozzles openings.

FIG. 3 shows a schematic cross sectional view along the line III-III shown in FIG. 1 and FIG. 2.

MODE FOR THE INVENTION

With reference to FIG. 1, FIG. 2 and FIG. 3 preferred embodiments shall be described. The fluid discharging device 1 comprises a base body 5 having a cylindrical form with an axial cylindrical opening in order to receive an inserted inner nozzle 3. The inner nozzle 3 is sealed against base body 5 with ribs 15 and may be further fixed at its mouth 21 against the base body 5, e.g. with a tube like portion 13. Between the outer wall of inner nozzle 3 and the inner wall of base body 5 the outer nozzle 12 is formed.

The tube like portion 13 has ribs 15 at its inner wall. The ribs 15 on the one hand fix the inner nozzle 3 and on the other hand form openings for the orifice 14 of the outer nozzle 12 so that plural streams of fluid may be discharged. FIG. 3 shows five ribs 15 which result in five opening of the nozzles orifice 14—however for securely fixing nozzle 3 at its mouth against base body 5 three ribs will be sufficient. Alternatively the inner nozzle 3 may be welded to the base body 5 with only one rib.

Liquid L1 is introduced to the outer nozzle 12 by liquid inlet 11. Liquid inlet 11 is connected to a first liquid source (not shown) via liquid pipe 10.

The inner nozzle 3 comprises an injection chamber 23, which has a larger diameter as the inner nozzle's mouth 21. The injection chamber 23 is connected to a gas source (not shown) via the gas inlet 26 and gas pipe 25 for feeding gas G into the injection chamber 23. Liquid L2 is injected into the injection chamber 23 via injection nozzle 22. Injection nozzle 22 is connected to a second liquid source (not shown) via liquid pipe 24.

The outer nozzles mouth 14 is circumferentially surrounded by a splash guard 36. The splash guard 36 has a conical form with a sharp edge 37 (angle 5°-85°; here)50°. The orifices of inner and outer nozzle 21 and 14 insofar lay recessed in the centre of said splash guard. The recess r is about 2 mm, but may be from 0.5 mm to 10 mm.

The inner nozzle 12 is further connected to a vacuum source (not shown) through opening 31 and vacuum pipe 30. The distance between opening 31 and outer nozzle's mouth 12 is greater than the distance between liquid inlet 11 and outer nozzle's mouth 12. Nozzle 12 may thus alternatively serve as vacuum suction nozzle and liquid discharge nozzle. Switching from liquid discharge mode to suction mode may be done with valves (not shown) in the respective pipes 10 and 30.

An annular suction nozzle 35 is arranged adjacent to the outer edge 37 of the splash guard. The suction nozzle 35 is connected to a pressure distribution chamber 33 by a plurality of vacuum channel 34. The pressure distribution chamber 33 is connected to a vacuum source (not shown) through a vacuum channel 32 opening 31 and vacuum pipe 30. If liquid flow may be selected at a higher range a check valve (not shown) may be used in vacuum channel 32 in order to avoid liquid L1 to be discharged through the outer vacuum nozzle 35.

Droplets collected by the splash guard 36, which are radially moved outwards towards the edge 37 are sucked through the annular nozzle 35. Simultaneously droplets collected by the splash guard 36, which are radially moved inwards, are sucked through the annular outer nozzle 14.

The base body 5 (together with all elements attached thereto) is fixed by mounting element 43 to a media arm 40. The media arm may either be suspended on a rotation axis (Z') perpendicular to the wafer's main surface in order to make a pivoting movement or may be suspended for a lateral movement substantially parallel to the wafer's main surface.

Following a wet treatment process (here a cleaning process for cleaning a semiconductor wafer) shall be described.

A wafer is chucked by a spin chuck and rotated at a spin speed of 300 rpm about an axis Z perpendicular to the wafer's main surfaces. A first liquid (e.g. diluted aqueous solution of ammoniac and hydrogen peroxide) is supplied by nozzle 12 (trough orifices 14) onto the wafer surface. Thereby the nozzle scans across the wafer in order to reach every place of the wafer surface area. During scanning of nozzle across the surface the distance dn of the nozzle to the wafer W may be kept constant or changed. In a preferred mode the nozzle has a distance dn of 5 mm. If the nozzle is with respect to the splash guards edge 37 recessed by 2 mm the distance de of the edge to the wafer W is 3 mm.

After liquid L1 supply through nozzle 12 is switched off, vacuum V is supplied to nozzles 12 and annular suction nozzle 35 in order to avoid dripping from the nozzle.

Simultaneously with start of applying vacuum V or immediately thereafter gas G is started to be supplied through pipe 25, injection chamber 23 and channel 20 of nozzle 3. Immediately after start of gas supply the second liquid L2 is injected to the injection chamber 23 at high pressure (e.g. 5 bar) in order to form fine droplets, which were then accelerated through channel 20 and aerosol A is supplied to the wafer's surface.

Simultaneously vacuum is still applied to orifices 14 and 35 so that excess liquid droplets reflected from the surface may be sucked away before they can reach ambience.

Whilst the nozzle scans across the wafer throughout the process it is helpful as a last step if the nozzle scans from the centre to the edge of the wafer.

The invention claimed is:
1. A fluid discharging device (1) for separately discharging at least two fluids comprising:
    an inner nozzle (3) for discharging an aerosol; and
    a coaxially arranged outer nozzle (12) for discharging a liquid,
    wherein said inner nozzle is connected to at least one liquid source and to at least one gas source for dispensing an aerosol wherein the outer nozzle is operatively connected to a liquid source,
    wherein a suction device operatively connected to a vacuum source, said suction device comprises suction orifice(s) (35) annularly arranged surrounding said outer and inner nozzle, a sharp edge (37) having an angle of below 90° degree between said outer nozzle (12) and said suction orifice(s) (35).

2. The fluid discharging device according to claim 1, wherein the outer nozzle is at the nozzle's opening (14) divided by a connection of the outer nozzle's inner wall with the outer nozzle's outer wall, in order to discharge a fluid flow with a cross sectional shape of an open ring.

3. The fluid discharging device according to claim 2, wherein the outer nozzle is at the nozzle's opening (14) split into at least two separate parts of the nozzle, in order to discharge said second fluid in at least two separate fluid flows.

4. The fluid discharging device according to claim 1, wherein the outer nozzle is operatively connected to the vacuum source.

5. A device for wet treatment of disc-shaped articles comprising a fluid discharging device according to claim 1.

6. The device for wet treatment according to claim 5, further comprising a support for rotating a disc-shaped article about an axis (Z) substantially perpendicular to said disc-shaped article's main surface.

7. The device for wet treatment according to claim 5, wherein the fluid discharging device is located on a media arm, with a suspension device for said media arm, so that the media arm can perform movement across a disc-shaped article's main surface when treated.

* * * * *